United States Patent
Huang

(10) Patent No.: US 12,278,650 B2
(45) Date of Patent: Apr. 15, 2025

(54) DATA CODING PROCESSING METHOD AND APPARATUS, STORAGE MEDIUM, AND ELECTRONIC DEVICE

(71) Applicant: ZTE Corporation, Shenzhen (CN)

(72) Inventor: Xingang Huang, Shenzhen (CN)

(73) Assignee: ZTE CORPORATION, Shenzhen (CN)

(*) Notice: Subject to any disclaimer, the term of this patent is extended or adjusted under 35 U.S.C. 154(b) by 0 days.

(21) Appl. No.: 18/283,860

(22) PCT Filed: Mar. 21, 2022

(86) PCT No.: PCT/CN2022/082020
§ 371 (c)(1),
(2) Date: Sep. 25, 2023

(87) PCT Pub. No.: WO2022/199529
PCT Pub. Date: Sep. 29, 2022

(65) Prior Publication Data
US 2024/0039556 A1    Feb. 1, 2024

(30) Foreign Application Priority Data
Mar. 24, 2021   (CN) .......................... 202110316283.0

(51) Int. Cl.
*H03M 13/11*     (2006.01)
*H03M 13/27*     (2006.01)
*H03M 13/33*     (2006.01)

(52) U.S. Cl.
CPC ....... *H03M 13/11* (2013.01); *H03M 13/2757* (2013.01); *H03M 13/33* (2013.01)

(58) Field of Classification Search
CPC .. H03M 13/11; H03M 13/2757; H03M 13/33; H03M 13/2707; H03M 13/2906;
(Continued)

(56) References Cited

U.S. PATENT DOCUMENTS

| 2007/0104225 A1 | 5/2007 | Mizuochi et al. |
| 2007/0245215 A1 | 10/2007 | Hwang et al. |

(Continued)

FOREIGN PATENT DOCUMENTS

| CN | 108111256 A | 6/2018 |
| CN | 111835462 A | 10/2020 |

OTHER PUBLICATIONS

International Search Report for corresponding application PCT/CN2022/082020 filed Mar. 21, 2022; Mail date May 30, 2022.

(Continued)

*Primary Examiner* — Thien Nguyen
(74) *Attorney, Agent, or Firm* — CANTOR COLBURN LLP

(57) ABSTRACT

A data coding processing method and apparatus, a storage medium, and an electronic device are provided. The method includes: acquiring discontinuous data from a plurality of data blocks used for Forward Error Correction (FEC) coding to form a plurality of target data blocks; determining parity information of FEC code words respectively according to the plurality of target data blocks, so as to obtain a plurality of pieces of parity information; and forming coded data by the plurality of pieces of parity information and the plurality of data blocks used for FEC coding.

16 Claims, 5 Drawing Sheets

(58) Field of Classification Search
CPC ............. H03M 13/2909; H04L 1/0057; H04L 1/0071; H04L 1/0041; H04L 1/004; H04L 1/0043; H04L 1/0061
See application file for complete search history.

(56) References Cited

U.S. PATENT DOCUMENTS

2018/0041228 A1    2/2018  Park et al.
2021/0184700 A1*   6/2021  Tu .................... H03M 13/2792

OTHER PUBLICATIONS

Andy Shen Futurewei Technologies USA: "Downstream Synchronization State Machine Supporting OLT-Configuration Bit-Interleaving in 50G-PON", vol. 2/15, Oct. 16, 2020, pp. 1-3, XP044302546.
European Search Report for corresponding application EP22774188; Report Jul. 12, 2024.
Werner Van Hoof Nokia Belgium: "G.hsp: Reducing ONU complexity through FEC codeword interleaving; C1914", vol. 2/15, Jan. 14, 2020, pp. 1-6, XP044280966.

* cited by examiner

DATA CODING PROCESSING METHOD AND APPARATUS, STORAGE MEDIUM, AND ELECTRONIC DEVICE

CROSS-REFERENCE TO RELATED APPLICATION

The present disclosure is a National Stage Filing of the PCT International Application No. PCT/CN2022/082020 filed on Mar. 21, 2022, which claims priority to Chinese patent application No. CN202110316283.0, entitled "DATA CODING PROCESSING METHOD AND APPARATUS, STORAGE MEDIUM, AND ELECTRONIC DEVICE", filed on Mar. 24, 2021, the entire contents of which are incorporated herein by reference.

TECHNICAL FIELD

Embodiments of the present disclosure relate to the field of communication, and more particularly relate to a data coding processing method and apparatus, a storage medium, and an electronic device.

BACKGROUND

In the study of the 50G-Passive Optical Network (PON) standard, it turns out that the use of equalizers can change the distribution of error bits, leading to an increase in the probability of longer continuous bit errors, which affects the performance of Forward Error Correction (FEC) algorithms. In order to solve the problem, a proposal is put forward to solve the problem of the continuous bit errors by performing bit interleaving after FEC coding. However, after bit interleaving is introduced, a downlink physical synchronization sequence (Psync) is distributed among a plurality of FEC code words, a downlink synchronization algorithm is complex, and time delay is increased.

So far, no solution has been proposed to solve the problems of distribution of a downlink Psync among a plurality of FEC code words, complex downlink synchronization algorithm and the increase in time delay after the introduction of bit interleaving in the related art.

SUMMARY

The embodiments of the present disclosure provide a data coding processing method and apparatus, a storage medium, and an electronic device, which may at least solve the problems of distribution of a downlink Psync among a plurality of FEC code words, complex downlink synchronization algorithm and the increase in time delay after the introduction of bit interleaving in the related art.

According to an embodiment of the present disclosure, a data coding processing method is provided, and includes:
  acquiring discontinuous data from a plurality of data blocks used for Forward Error Correction (FEC) coding to form a plurality of target data blocks;
  determining parity information of FEC code words respectively according to the plurality of target data blocks, so as to obtain a plurality of pieces of parity information; and
  forming coded data by the plurality of pieces of parity information and the plurality of data blocks used for FEC coding.

According to another embodiment of the present disclosure, a data coding processing apparatus is further provided, and includes:
  an acquiring module, configured to acquire discontinuous data from a plurality of data blocks used for FEC coding to form a plurality of target data blocks;
  a determining module, configured to determine parity information of FEC code words respectively according to the plurality of target data blocks, so as to obtain a plurality of pieces of parity information; and
  a combination module, configured to form coded data by the plurality of pieces of parity information and the plurality of data blocks used for FEC coding.

According to another embodiment of the present disclosure, a computer-readable storage medium is further provided, and stores computer programs. The computer programs, when running on a processor, cause the processor to perform the operations in any above method embodiment.

According to another embodiment of the present disclosure, an electronic device is further provided, and includes a memory and a processor. The memory stores computer programs, and the processor is configured to operate the computer programs so as to perform the operations in any above method embodiment.

According to the embodiments of the present disclosure, the discontinuous data is acquired from the plurality of data blocks used for FEC coding to form the plurality of target data blocks; the parity information of the FEC code words is determined respectively according to the plurality of target data blocks so as to obtain the plurality of pieces of parity information; and the coded data is formed by the plurality of pieces of parity information and the plurality of data blocks used for FEC coding. Thus, the problems of distribution of a downlink Psync among a plurality of FEC code words, the complex downlink synchronization algorithm and the increased time delay due to introduction of bit interleaving in the related art can be solved. By determining the parity information based on the discontinuous data bits in data information and sending the parity information together with the data information, it is possible to use the parity information to correct errors generated in the data information transmission process, thereby reducing the bit error rate and improving the quality of link signal transmission.

DETAILED DESCRIPTION

The embodiments of the present disclosure are described in detail with reference to drawings and in combination with embodiments as below.

It is to be noted that the terms such as "first" and "second" of the specification and the claims of the present disclosure and the above drawings are used to distinguish similar objects but are not used to describe specific sequences or precedence orders.

Figure 1:
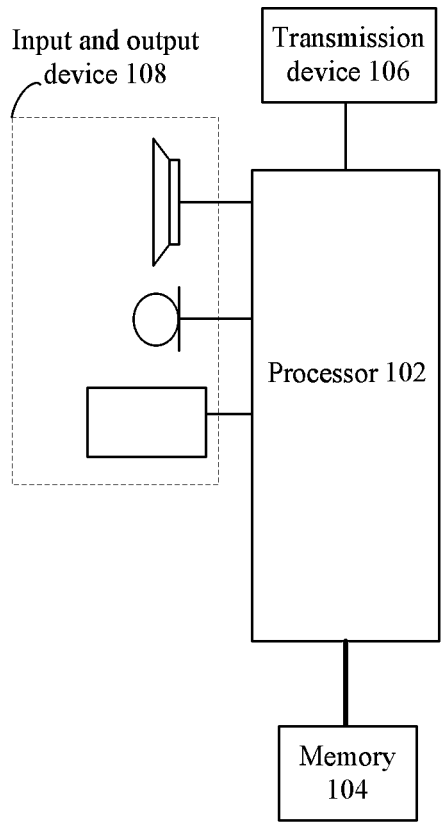
FIG. 1 is a block diagram of a hardware structure of a mobile terminal that implements a data coding processing method according to an embodiment of the present disclosure.

The method embodiments provided in the embodiments of the present disclosure may be performed in a mobile terminal, a computer terminal, or similar arithmetic units. Taking the implementation of the method embodiments on a mobile terminal as an example, FIG. 1 is a block diagram of a hardware structure of a mobile terminal that implements a data coding processing method according to an embodiment of the present disclosure. As shown in FIG. 1, the mobile terminal may include one or more (only one is shown in FIG. 1) processors 102 (the processor 102 may include but not limited to a Microcontroller Unit (MCU), or a Field-Programmable Gate Array (FPGA), or another processing unit) and a memory 104 configured to store data. The mobile terminal may further include a transmission device 106 used for a communication function and an input and output device 108. Those having ordinary skill in the art can understand that the structure shown in FIG. 1 is merely illustrative, and does not limit a structure of the above mobile terminal. For example, the mobile terminal may further include more or fewer components than shown in FIG. 1, or have a different configuration than that shown in FIG. 1.

The memory 104 may be configured to store computer programs, such as software programs and modules of application software, and computer programs corresponding to the data coding processing method according to the embodiments of the present disclosure. The processor 102 performs, by running the computer programs stored in the memory 104, various functional applications and service chain address pool slice processing, thereby implementing the above method. The memory 104 may include a high-speed random access memory, and may further include a nonvolatile memory, such as one or more magnetic memories, flash memories or other nonvolatile solid state memories. In some examples, the memory 104 may further include memories which are remotely set relative to the processor 102, and these remote memories may be connected to the mobile terminal through networks. The examples of the above networks include but not limited to an Internet, an intranet, a local area network, a mobile communication network and a combination thereof.

The transmission device 106 is configured to receive or send data through a network. A specific example of the above networks may include a wireless network provided by a communication supplier of the mobile terminal. In an example, the transmission device 106 includes a Network Interface Controller (NIC) which can be connected with other network devices through a base station so as to communicate with the Internet. In an example, the transmission device 106 may be a Radio Frequency (RF) module configured to communicate with the Internet in a wireless manner.

Figure 2:
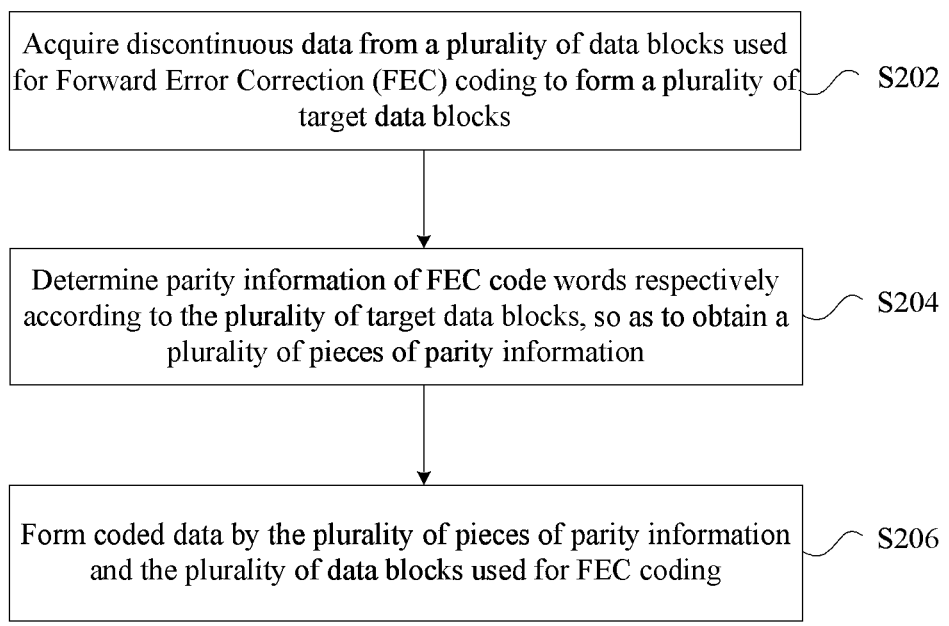
FIG. 2 is a flowchart of a data coding processing method according to an embodiment of the present disclosure.

The embodiment provides a data coding processing method operating on the above mobile terminal or a network architecture. FIG. 2 is a flowchart of a data coding processing method according to an embodiment of the present disclosure. As shown in FIG. 2, the process includes operations S202 to S206.

At S202, discontinuous data is acquired from a plurality of data blocks used for Forward Error Correction (FEC) coding to form a plurality of target data blocks.

In an embodiment, the discontinuous data may be acquired according to a pre-negotiated interleaving rule or a preset extraction manner (which may be, for example, preset extraction positions). The operation S202 may include the following process.

As an exemplary implementation, discontinuous data is acquired from a plurality of data blocks for FEC coding according to a interleaving rule to form a plurality of target data blocks. Taking two data blocks used for FEC coding as an example, data 1 is extracted from the first data block, data 2 is extracted from the second data block, data 3 is then extracted from the first data block, data 4 is extracted from the second data block, the extraction is repeatedly performed to obtain data 1, data 2, data 3, data 4 . . . , which are the discontinuous data. The extracted data 1, data 2, data 3, data 4 . . . form a plurality of target data blocks. The number of the formed target data blocks is determined based on the length of each target data block. If the length of the target data block is equal to the length of the data block used for FEC coding, the extracted discontinuous data may form two target data blocks. As an exemplary implementation, the first half of the extracted data 1, data 2, data 3, data 4 . . . form a target data block 1, while the second half of the extracted data 1, data 2, data 3, data 4 . . . form a target data block 2.

As another exemplary implementation, discontinuous data is acquired from a plurality of data blocks used for FEC coding according to preset extraction positions to form a plurality of target data blocks, that is, the discontinuous data is acquired according to the preset extraction positions. There may be various interleaving rules to acquire the discontinuous data from the plurality of data blocks used for FEC coding to form a target data block. Besides one-by-one extraction in the above exemplary implementation, interleaving may be performed according to a pre-designed position relationship, or even a random manner. The interleaving performed according to a preset position relationship is illustrated below as an example. As shown in Table 1, the first row represents coded data, where D11 to D18 represents the first data block used for FEC coding, and D21 to D28 represents the second data block used for FEC coding. The second row represents an interleaving rule, where the numbers represent positions after corresponding data-to-be-coded is interleaved, for example, the number 10 below D11 represents that the position of D11 after interleaving is 10. The third row represents data after interleaving, where the first 8 bits form the first target data block, and the next 8 bits form the second target data block. It can be seen that the first bit D22 of the interleaved data corresponds to data-to-be-coded corresponding to the number 1 in the interleaving rule.

TABLE 1

| Data-to-be-coded | D11 | D12 | D13 | D14 | D15 | D16 | D17 | D18 | D21 | D22 | D23 | D24 | D25 | D26 | D27 | D28 |
|---|---|---|---|---|---|---|---|---|---|---|---|---|---|---|---|---|
| Interleaving rule | 10 | 7 | 14 | 6 | 3 | 11 | 9 | 12 | 13 | 1 | 5 | 8 | 16 | 4 | 15 | 2 |
| Interleaved data | D22 | D28 | D15 | D26 | D23 | D14 | D12 | D24 | D17 | D11 | D16 | D18 | D21 | D13 | D27 | D25 |

The length of the data block used for FEC coding may be the same as or different from the length of the target data block. For example, the length of the data block used for FEC coding may be two times, ½, or any other ratio compared to the length of the target data block. For example, in Table 1, if the length of the data block used for FEC coding is 8, the length of the target data block formed by the interleaved data may be equal to 8, 4 or 16.

There may be various interleaving rules to obtain discontinuous data bits from a plurality of pieces of parity information based on the interleaving rules to form a plurality of pieces of target parity information, such as one-by-one extraction in the above embodiment, or extraction according to a pre-designed position relationship, or even random interleaving.

In another embodiment, the operation S202 may include the following process.

Multiple sets of discontinuous data are repeatedly acquired from the plurality of data blocks used for FEC coding according to an order of the plurality of data blocks used for FEC coding, where each set of discontinuous data in the multiple sets of discontinuous data includes a datum obtained from each of the plurality of data blocks used for FEC coding. The multiple sets of discontinuous data may be acquired according to the aforementioned interleaving rule or the pre-set extraction positions.

The multiple sets of discontinuous data are combined according to an acquiring order to form the plurality of target data blocks. As an exemplary implementation, in a case that a length of each target data block is greater than a length of each data block used for FEC coding, at least two sets of discontinuous data in the multiple sets of discontinuous data acquired from the plurality of data blocks used for FEC coding form a target data block according to the acquiring order, so as to obtain the plurality of target data blocks. In a case that the length of each target data block is equal to the length of each data block used for FEC coding, each set of discontinuous data in the multiple sets of discontinuous data acquired from the plurality of data blocks used for FEC coding forms a target data block according to the acquiring order, so as to obtain the plurality of target data blocks. In a case that the length of each target data block is less than the length of each data block used for FEC coding, each set of discontinuous data in the multiple sets of discontinuous data acquired from the plurality of data blocks used for FEC coding forms at least two target data blocks according to the acquiring order, so as to obtain the plurality of target data blocks.

At S204, parity information of FEC code words is determined respectively according to the plurality of target data blocks, so as to obtain a plurality of pieces of parity information.

In the embodiment, the operation S204 may include: FEC parity information calculation is performed for each of the plurality of target data blocks to obtain the plurality of pieces of parity information.

At S206, coded data is formed by the plurality of pieces of parity information and the plurality of data blocks used for FEC coding.

In the embodiment, the operation S206 may further include one of the following operations S2061 and S2062.

At S2061, discontinuous data bits are acquired from the plurality of pieces of parity information to form a plurality of pieces of target parity information.

At S2062, coded data is formed by the plurality of pieces of target parity information and the plurality of data blocks used for FEC coding.

In an exemplary embodiment, the operation S2061 may include:
the discontinuous data bits are acquired from the plurality of pieces of parity information according to an interleaving rule to form the plurality of pieces of target parity information, where the acquiring manner is similar to the above manner for acquiring the discontinuous data from a plurality of databases according to the interleaving rule, which is not repeated herein; or
the discontinuous data bits are acquired from the plurality of pieces of parity information according to the preset extraction positions to form the plurality of pieces of target parity information, where the specific acquiring manner is similar to the above manner for acquiring the discontinuous data from the plurality of databases according to the preset extraction positions, which is not repeated herein. In the present embodiment, the length of the target parity information may be the same as or different from the length of the parity information, for example, the length of the target parity information may be two times, ½, or any other ratio compared to the length of the parity information.

In an exemplary embodiment, the operation S2061 may include:
multiple sets of discontinuous data bits are repeatedly acquired from the plurality of pieces of parity information according to an order of the plurality of pieces of parity information, where each set of discontinuous data bits in the multiple sets of discontinuous data bits includes a data bit acquired from each of the plurality of pieces of parity information, and the specific acquiring manner may be implemented according to the above interleaving rule or the preset extraction positions; and
the plurality of pieces of target parity information is formed by the plurality of sets of discontinuous data bits according to an acquiring order. As an exemplary implementation, in a case that a length of each piece of target parity information is greater than a length of each piece of parity information, at least two sets of discontinuous data bits in the multiple sets of discontinuous data bits acquired from the plurality of pieces of parity information form a piece of target parity information according to the acquiring order, so as to obtain the plurality of pieces of target parity information. In a case that the length of each piece of target parity information is equal to the length of each piece of parity information, each set of discontinuous data bits in the multiple sets of discontinuous data bits acquired from the plurality of pieces of parity information forms a piece of target parity information according to the acquiring order, so as to obtain the plurality of pieces of target parity information. In a case that the length of each piece of target parity information is less than the length of each piece of parity information, each set of discontinuous data bits in the multiple sets of discontinuous data bits acquired from the plurality of pieces of parity information forms at least two pieces of target parity information according to the acquiring order, so as to obtain the plurality of pieces of target parity information.

According to the operations S202 to S206, the discontinuous data is acquired from the plurality of data blocks used for FEC coding to form the plurality of target data blocks; the parity information of the FEC code words is determined respectively according to the plurality of target data blocks so as to obtain the plurality of pieces of parity information; and the coded data is formed by the plurality of pieces of parity information and the plurality of data blocks used for FEC coding. Thus, the problems of distribution of a downlink Psync among a plurality of FEC code words, the complex downlink synchronization algorithm and the increased time delay due to introduction of bit interleaving in the related art can be solved. By determining the parity information based on the discontinuous data bits in data information and sending the parity information together with the data information, it is possible to use the parity information to correct errors generated in the data information transmission process, thereby reducing the bit error rate and improving the quality of link signal transmission.

In an embodiment, the operation S206 may include the following process.

The coded data is formed by respectively setting the plurality of pieces of parity information behind the data blocks corresponding to the target data blocks that correspond to the plurality of pieces of parity information, that is, the parity information of each data block is set behind the data block. As an exemplary implementation, the parity information of the first data block is set behind the first data block, and the parity information of the second data block is set behind the second data block, thereby obtaining the coded data. Alternatively, the plurality of pieces of parity information is set behind the plurality of data blocks used for FEC coding, so as to form the coded data, that is, all pieces of parity information (i.e., the parity information of the first data block and the second data block) is set behind the second data block (i.e., behind all the data blocks) to obtain the coded data.

In an exemplary embodiment, it is also possible to indicate enabling or disabling of the interleaving function, and/or enabling or disabling of the FEC function. As an exemplary implementation, by using different physical synchronization sequences (Psync), the interleaving function can indicated to be enabled or disabled, or the FEC function can be indicated to be enabled or disabled. As an exemplary implementation, the interleaving function or the FEC function is indicated to be disabled through a first Psync sequence Psync1, and the interleaving function or the FEC function is indicated to be enabled through a second Psync sequence Psync2; or, the interleaving function or the FEC function is indicated to be disabled through the Psync sequence, and the interleaving function or the FEC function is indicated to be enabled through a reverse or inverse sequence of the Psync.

By using the Psync, the interleaving function is indicated to be enabled or disabled, and the FEC function is indicated to be enabled or disabled. As an exemplary implementation, the interleaving function and the FEC function are indicated to be disabled through the Psync. Through a reverse sequence of the Psync, the interleaving function is enabled, and the FEC function is disabled. Through an inverse original sequence of the Psync, the interleaving function is indicated to be disabled, and the FEC function is indicated to be enabled. Through an reverse sequence of the inverse original sequence of the Psync, the interleaving function and the FEC function are indicated to be enabled.

In the related art, the use of an equalizer may result in the change of the bit error distribution, and in order to address the change of the bit error distribution, an interleaving process is adopted. However, the interleaving may result in the distribution of the Psync among multiple FEC code blocks. In order to address the problem of the distribution of the Psync among multiple FEC code blocks, an FEC code word organization method is provided in the embodiments.

Figure 3:
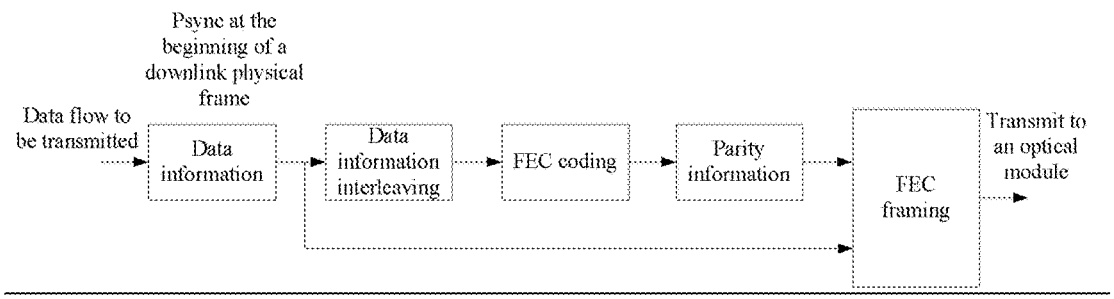
FIG. 3 is a flowchart of a coding processing method at the transmitting end according to an embodiment.

FIG. 3 is a flowchart of a coding processing method at the transmitting end according to an embodiment. As shown in FIG. 3, data information is acquired from a data flow to be transmitted, where the data information is the above discontinuous data, and the manner for acquiring the discontinuous data is similar to the above acquiring manner, which is not repeated herein. Interleaving processing is performed on the data information, and the interleaving processing manner is similar to the above manner, which is not repeated herein. Verification information is obtained by performing FEC coding calculation. FEC framing is performed based on the parity information and the data information to obtain coded data, and the coded data is transmitted. The data information is not continuous data bits, but rather discontinuous data bits sequentially obtained from data bits with corresponding lengths in a plurality of FEC code words according to the interleaving rule, and these discontinuous data bits serve as the data information based on which FEC parity information calculation is performed. After the parity information is obtained, according to an original order, the data bits and the parity information form FEC code words to be transmitted. Alternatively, after the data bits of the multiple sets of FEC code words are transmitted according to the original order, the corresponding multiple sets of parity information are transmitted together.

Figure 4:
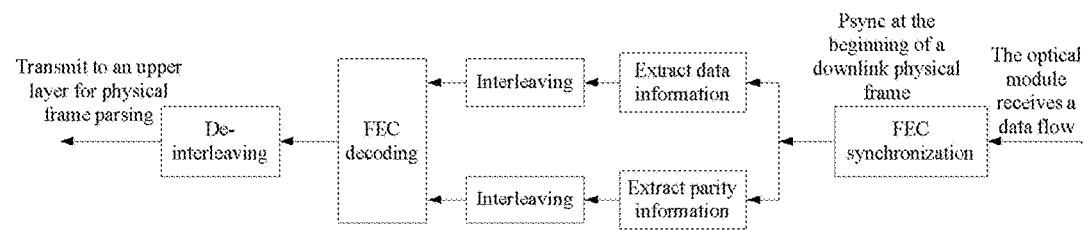
FIG. 4 is a flowchart of a decoding processing method at the receiving end according to an embodiment.

FIG. 4 is a flowchart of a decoding processing method at the receiving end according to an embodiment. As shown in FIG. 4, coded data is received and is subject to FEC synchronization processing, and data information and parity information are extracted, and are subject to interleaving processing according to a manner the same as the manner for a transmitting end to obtain interleaved data information and interleaved parity information, and then FEC decoding and de-interleaving processing are performed. During decoding, discontinuous data bits are extracted from received bit stream according to the interleaving rule as data information, and FEC decoding calculation is performed based on the data information to obtain error-corrected data bits.

By virtue of the above solution, the downlink physical synchronization header Psync can be kept at the beginning of a downlink physical frame without being scattered across multiple FEC code words, which is beneficial to fast downlink synchronization. Meanwhile, the processing logic is unified, algorithm design is simple, and the chip cost is reduced.

Figure 5:
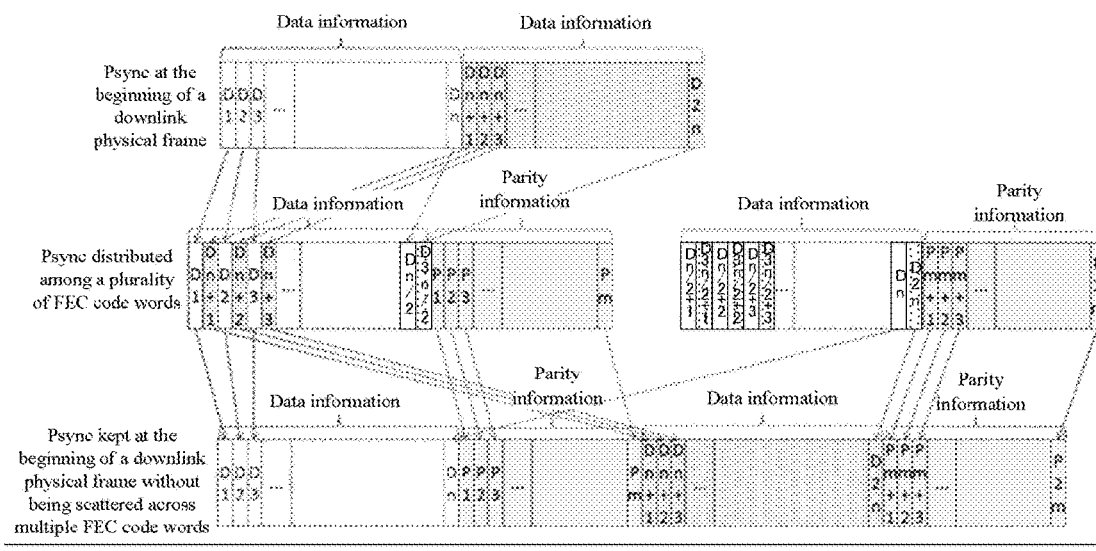
FIG. 5 is a first schematic diagram of continuous error bit suppression coding according to an embodiment.

The following is an example of interleaving with an interleaving period of 2 FEC code words. FIG. 5 is a first schematic diagram of continuous error bit suppression coding according to an embodiment. As shown in FIG. 5, if the number n of data information bits in the FEC code word is even, the first FEC code word includes D1, D2, D3, . . . , and Dn, and the second FEC code word includes Dn+1, Dn+2, Dn+3, . . . , and D2n. First, D1 is extracted from the first FEC code word, Dn+1 is extracted from the second FEC code word, then, D2 is extracted from the first FEC code word, Dn+2 is extracted from the second FEC code word, then Dn+1 is extracted from the second FEC code word, D3 is extracted from the first FEC code word, Dn+3 is extracted from the second FEC code word, and the above operations are repeatedly performed until Dn is extracted from the first FEC code word, and D2n is extracted from the second FEC code word. Extracted D1, Dn+1, D2, Dn+2, D3, Dn+3, . . . , Dn/2, and D3n/2 serve as a first target bit data, and extracted Dn/2+1, D3n/2+1, Dn/2+2, D3n/2+1, Dn/2+1, . . . , Dn, and D2n serve as a second target bit data. Parity information P1, P2, P3, . . . , and Pm of the first FEC code word is calculated according to D1, Dn+1, D2, Dn+2, D3, Dn+3, . . . , Dn/2, and D3n/2, and parity information Pm+1, Pm+2, Pm+3, . . . , and P2m of the second FEC code word is calculated according to Dn/2+1, D3n/2+1, Dn/2+2, D3n/2+1, Dn/2+1, . . . , Dn, and D2n. Then, the parity information of the first FEC code word is set behind the first FEC code word, the parity information of the second FEC code word is set behind the second FEC code word, and thus, coded data is obtained and directly transmitted. Interleaving may also be performed with multiple code words as a period according to the needs. The manner for interleaving multiple code words is similar to the above manner for interleaving two code words, which is not repeated herein.

Figure 6:
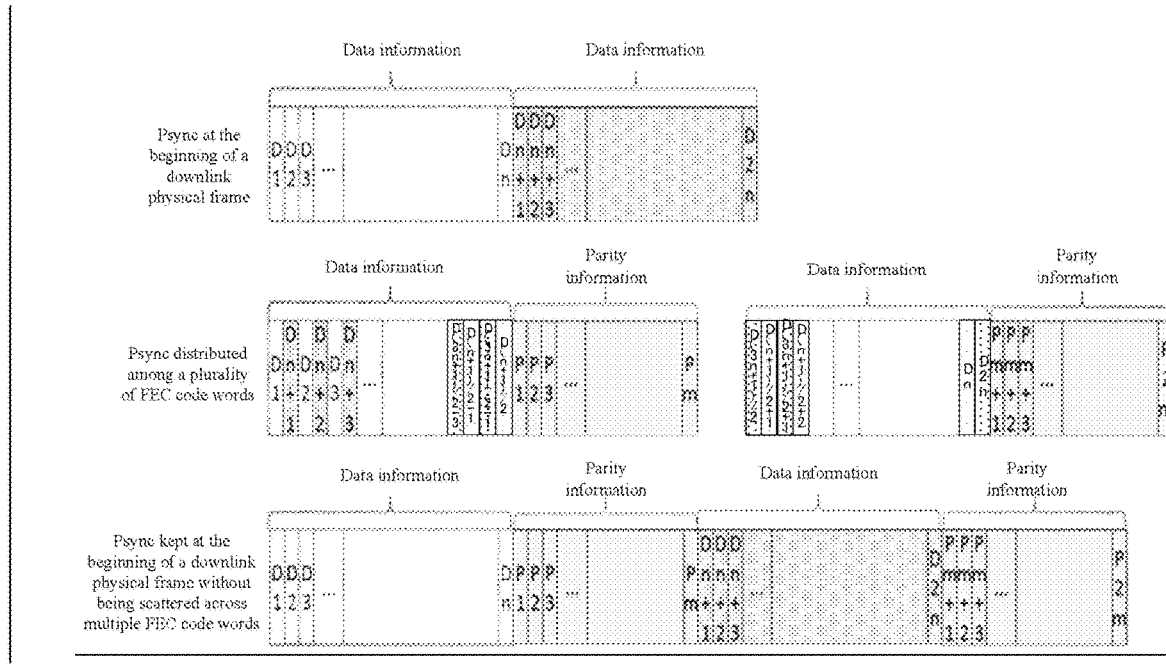
FIG. 6 is a second schematic diagram of continuous error bit suppression coding according to an embodiment.

FIG. 6 is a second schematic diagram of continuous error bit suppression coding according to an embodiment. As shown in FIG. 6, if the number n of data information bits in the FEC code word is odd, the first FEC code word includes D1, D2, D3, . . . , and Dn, and the second FEC code word includes Dn+1, Dn+2, Dn+3, . . . , and D2n. First, D1 is extracted from the first FEC code word, Dn+1 is extracted from the second FEC code word, then, D2 is extracted from the first FEC code word, Dn+2 is extracted from the second FEC code word, then Dn+1 is extracted from the second FEC code word, D3 is extracted from the first FEC code word, Dn+3 is extracted from the second FEC code word, and the above operations are repeatedly performed until Dn is extracted from the first FEC code word, and D2n is extracted from the second FEC code word. Extracted D1, Dn+1, D2, Dn+2, D3, Dn+3, . . . , D(3n+1)/2−1, and D(n+1)/2 serve as a first target bit data, and extracted D(3n+1)/2, D(n+1)/2+1, D(3n+1)/2+1, D(n+1)/2+2, . . . , Dn, and D2n serve as a second target bit data. Parity information P1, P2, P3, . . . , and Pm of the first FEC code word is calculated according to D1, Dn+1, D2, Dn+2, D3, Dn+3, . . . , D(3n+1)/2−1, and D(n+1)/2, and parity information Pm+1, Pm+2, Pm+3, . . . , and P2m of the second FEC code word is calculated according to D(3n+1)/2, D(n+1)/2+1, D(3n+1)/2+1, D(n+1)/2+2, . . . , Dn, and D2n. Then, the parity information of the first FEC code word is set behind the first FEC code word, the parity information of the second FEC code word is set behind the second FEC code word, and thus, coded data is obtained and directly transmitted.

Figure 7:
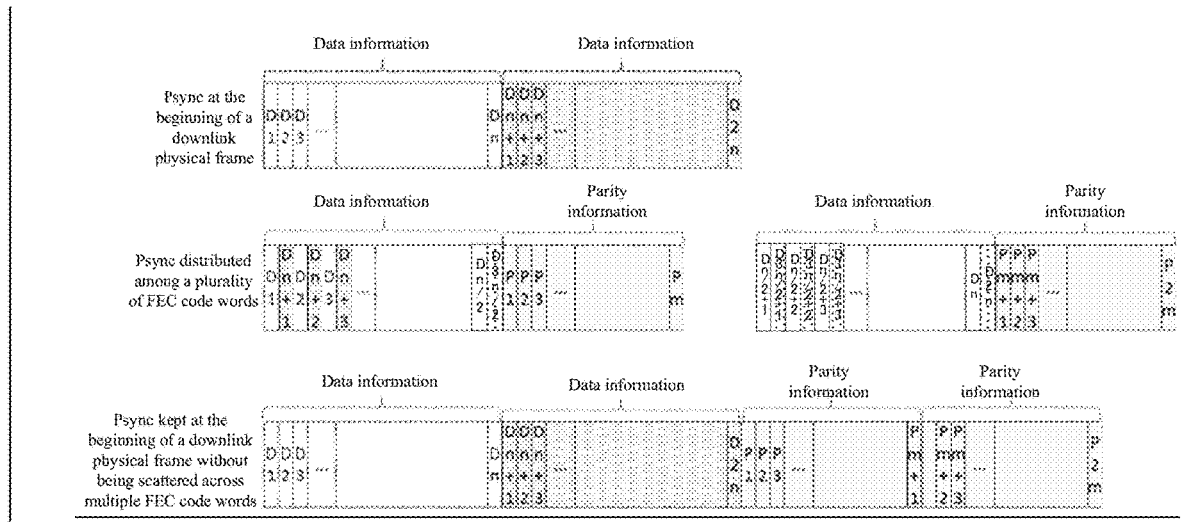
FIG. 7 is a third schematic diagram of continuous error bit suppression coding according to an embodiment.

FIG. 7 is a third schematic diagram of continuous error bit suppression coding according to an embodiment. As shown in FIG. 7, if the number n of data information bits in the FEC code word is even, the first FEC code word includes D1, D2, D3, . . . , and Dn, and the second FEC code word includes Dn+1, Dn+2, Dn+3, . . . , D2n. First, D1 is extracted from the first FEC code word, Dn+1 is extracted from the second FEC code word, then, D2 is extracted from the first FEC code word, Dn+2 is extracted from the second FEC code word, then Dn+1 is extracted from the second FEC code word, D3 is extracted from the first FEC code word, Dn+3 is extracted from the second FEC Code word, and the above operations are repeatedly performed until Dn is extracted from the first FEC code word, and D2n is extracted from the second FEC code word. Extracted D1, Dn+1, D2, Dn+2, D3, Dn+3, . . . , Dn/2, and D3n/2 serve as a first target bit data, and extracted Dn/2+1, D3n/2+1, Dn/2+2, D3n/2+1, Dn/2+1, . . . , Dn, and D2n serve as a second target bit data. Parity information P1, P2, P3, . . . , and Pm of the first FEC code word is calculated according to D1, Dn+1, D2, Dn+2, D3, Dn+3, . . . , Dn/2, and D3n/2, and parity information Pm+1, Pm+2, Pm+3, . . . , and P2m of the second FEC code word is calculated according to Dn/2+1, D3n/2+1, Dn/2+2, D3n/2+1, Dn/2+1, . . . , Dn, and D2n. Then, all the parity information (i.e., the parity information of the first FEC code word and the Second FEC code word) is set behind the FEC code words, and thus, coded data is obtained and Directly transmitted. In other words, in the interleaving period, the data information is transmitted Together, and the parity information is transmitted together.

Figure 8:
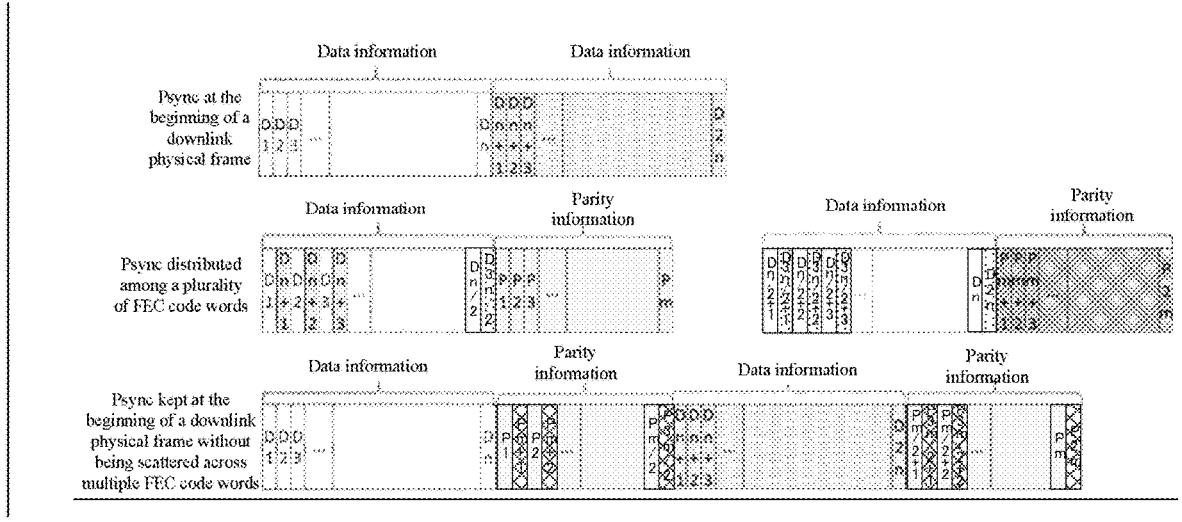
FIG. 8 is a fourth schematic diagram of continuous error bit suppression coding according to an embodiment.

FIG. 8 is a fourth schematic diagram of continuous error bit suppression coding according to an embodiment. As shown in FIG. 8, if the number n of data information bits in the FEC code word is even, the first FEC code word includes D1, D2, D3, . . . , and Dn, and the second FEC code word includes Dn+1, Dn+2, Dn+3, . . . , and D2n. First, D1 is extracted from the first FEC code word, Dn+1 is extracted from the second FEC code word, then, D2 is extracted from the first FEC code word, Dn+2 is extracted from the second FEC code word, then Dn+1 is extracted from the second FEC code word, D3 is extracted from the first FEC code word, Dn+3 is extracted from the second FEC code word, and the above operations are repeatedly performed until Dn is extracted from the first FEC code word, and D2n is extracted from the second FEC code word. Extracted D1, Dn+1, D2, Dn+2, D3, Dn+3, . . . , Dn/2, and D3n/2 serve as a first target bit data, and extracted Dn/2+1, D3n/2+1, Dn/2+2, D3n/2+1, Dn/2+1, . . . , Dn, and D2n serve as a second target bit data. Parity information P1, P2, P3, . . . , and Pm of the first FEC code word is calculated according to D1, Dn+1, D2, Dn+2, D3, Dn+3, . . . , Dn/2, and D3n/2, and parity information Pm+1, Pm+2, Pm+3, . . . , and P2m of the second FEC code word is calculated according to Dn/2+1, D3n/2+1, Dn/2+2, D3n/2+1, Dn/2+1, . . . , Dn, and D2n. Then, the parity information of the first FEC code word and the parity information of the second FEC code word are interleaved according to an interleaving rule. P1 is extracted from the parity information of the first FEC code word, Pm+1 is extracted from the parity information of the second FEC code word, P2 is extracted from the parity information of the first FEC code word, Pm+2 is extracted from the parity information of the second FEC code word, and the above operations are repeatedly performed until Pm is extracted from the parity information of the first FEC code word, and P2m is extracted from the parity information of the second FEC code word. The parity information P1, Pm+1, P2, Pm+2, . . . , Pm/2, and P3m/2 is set behind the first FEC code word, the parity information Pm/2+1, P3m/2+1, Pm/2+2, P3m/2+2, . . . , Pm, and P2m is set behind the second FEC code word, and coded data is obtained and directly transmitted. In other words, the parity information is interleaved and then transmitted together with the data information.

The specific 50G-PON FEC algorithm adopts the Quasi-Cyclic Low-Density-Parity-Check Codes (QC-LDPC) (17280, 14592) coding/decoding algorithm. The length of the code word data information is 14592 bits, and the length of the parity information is 2688 bits. A period of 4 code words is used as the interleaving period, which means that 58368 data bits form a group. The interleaved data information is obtained in the following pattern: 1, 14592+1, 24592*2+1, 14592*3+1, 2, 14592+2, 24592*2+2, and 14592*3+2.Take the first 14592 bits of the interleaved data information as data information of a first Low Density Parity Check Code (LDPC) coded code word for coding to obtain first LDPC code word parity information. Take the second 14592 bits of the interleaved data information as data information of a second LDPC coded code word for coding to obtain second LDPC code word parity information. Take the third 14592 bits of the interleaved data information as data information of a third LDPC coded code word for coding to obtain third LDPC code word parity information.

Take the fourth 14592 bits of the interleaved data information as data information of a fourth LDPC coded code word for coding to obtain fourth LDPC code word parity information. After the parity information of the four LDPC code words is obtained, the parity information is combined with original non-interleaved 58368 data bits to form the four LDPC code words. These LDPC code words are then sent to an optical module to be converted into optical signals to be transmitted to a peer device for receiving and decoding. The specific manner for forming the LDPC code words may be chosen from any of the aforementioned manners.

50G-PON requires support for optional interleaving functions. An Optical Line Terminal (OLT) is required to indicate an Optical Network Unit (ONU) to enable or disable interleaving. Therefore, two types of Psync code pattern sequences may be defined as indicators for enabling or disabling interleaving. Psync1 represents disabling, while Psync2 represents enabling. This method does not modify an existing PON protocol frame format, does not add new fields, and therefore has good compatibility.

A simple method is to use a Psync code pattern to represent disabling of interleaving, while an inverting or reversing sequence of the Psync code pattern represents enabling of interleaving. For example, using the Psync code pattern 0xC5E5 1840 FD59 BB49 in an existing 10-gbit Passive Optical Network (XG-PON) system represents disabling of interleaving, while inverting the Psync code pattern represents enabling of interleaving, which is represented by 0x3A1AE7BF02A644B6.

As an exemplary implementation, whether the FEC is enabled or not may also be represented by Psync code words. There are four combinations of inversion and reverse order, which can be used as indicators for enabling and disabling of FEC and interleaving. For example, the original Psync sequence is used as an indicator for disabling the FEC and interleaving. Inverting the original Psync sequence represents enabling of the FEC and disabling of interleaving. The inverse original sequence of Psync is used as an indicator for disabling the FEC and enabling interleaving. Inverting the inverse original sequence of Psync is used as an indicator for enabling the FEC and interleaving.

For example, the Psync code pattern 0xC5E5 1840 FD59 BB49 in the existing XG-PON system represents disabling of the FEC and interleaving, while the inverted code pattern of Psync represents enabling of the FEC and disabling of interleaving.

The inverse code pattern 0x92DD9ABF0218A7A3 of Psync represents disabling of the FEC and enabling of interleaving, and the inverse and inverted code pattern 0x6D226540FDE7585C of Psync represents enabling of the FEC and enabling of interleaving.

A binary sequence corresponding to XG-PON Psync 0xC5E5 1840 FD59 BB49 is 1100010111100101000110000100000011111101010110011011101101001001.

A binary sequence corresponding to inverted Psync 0x3A1AE7BF02A644B6 is 0011101000011010111001111011111110000010101001100100010010110110.

A binary sequence corresponding to an inverse Psync 0x92DD9ABF0218A7A3 is 1001001011011011001101010111111000001000011000101001111010100011.

A binary sequence corresponding to an inverted code pattern of the inverse Psync is 0110110100100010011001010100000011111101111001110101100001011100.

In the embodiment, the data information is not continuous data bits, but rather discontinuous data bits sequentially obtained from data bits with corresponding lengths in the plurality of FEC code words according to the interleaving rule, and these discontinuous data bits serve as the data information to perform FEC parity information calculation. After the parity information is obtained, according to an original order, the data bits and the parity information form FEC code words to be transmitted. Alternatively, after the data bits of the multiple sets of FEC code words are transmitted according to the original order, the corresponding multiple sets of parity information are transmitted together. During decoding, discontinuous data bits are acquired from received bit stream according to the interleaving rule as data information, and FEC decoding calculation is performed based on the data information so as to obtain error-corrected data bits.

Figure 9:
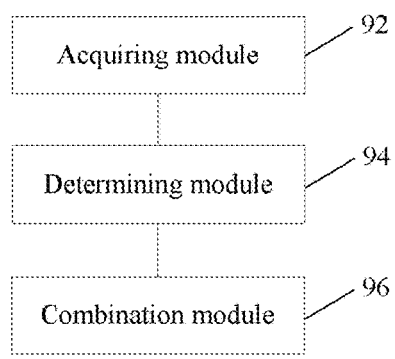
FIG. 9 is a block diagram of a data coding processing apparatus according to an embodiment.

According to another embodiment of the present disclosure, a data coding processing apparatus is further provided. FIG. 9 is a block diagram of a data coding processing apparatus according to an embodiment. As shown in FIG. 9, the apparatus includes:
  an acquiring module 92, configured to acquire discontinuous data from a plurality of data blocks for FEC coding to form a plurality of target data blocks;
  a determining module 94, configured to determine parity information of FEC code words respectively according to the plurality of target data blocks, so as to obtain a plurality of pieces of parity information; and
  a combination module 96, configured to form coded data by the plurality of pieces of parity information and the plurality of data blocks used for FEC coding.

In an exemplary embodiment, the acquiring module 92 is further configured to:
  acquire, according to an interleaving rule, the discontinuous data from the plurality of data blocks for FEC coding to form the plurality of target data blocks; or
  acquire, according to preset extraction positions, the discontinuous data from the plurality of data blocks used for FEC coding to form the plurality of target data blocks.

In an exemplary embodiment, the acquiring module 92 includes:
  a first acquiring sub-module, configured to repeatedly acquire multiple sets of discontinuous data from the plurality of data blocks used for FEC coding according to an order of the plurality of data blocks used for FEC coding, where each set of discontinuous data in the multiple sets of discontinuous data includes a datum obtained from each of the plurality of data blocks used for FEC coding; and
  a first combination sub-module, configured to form the plurality of target data blocks by the multiple sets of discontinuous data according to an acquiring order.

In an exemplary embodiment, the first combination sub-module is further configured to:
  in a case that a length of each target data block is greater than a length of each data block used for FEC coding, form at least two sets of discontinuous data in the multiple sets of discontinuous data acquired from the plurality of data blocks used for FEC coding into a target data block according to the acquiring order, so as to obtain the plurality of target data blocks;
  in a case that the length of each target data block is equal to the length of each data block used for FEC coding, form each set of discontinuous data in the multiple sets of discontinuous data acquired from the plurality of data blocks used for FEC coding into a target data block according to the acquiring order, so as to obtain the plurality of target data blocks; and in a case that the length of each target data block is less than the length of each data block used for FEC coding, form each set of discontinuous data in the multiple sets of discontinuous data acquired from the plurality of data blocks used for FEC coding into at least two target data blocks according to the acquiring order, so as to obtain the plurality of target data blocks In an exemplary embodiment, the determining module 94 is further configured to:

perform FEC parity information calculation for each of the plurality of target data blocks to obtain the plurality of pieces of parity information.

In an exemplary embodiment, the combination module 96 is further configured to:

respectively set the plurality of pieces of parity information behind the data blocks corresponding to the plurality of target data blocks that correspond to the plurality of pieces of parity information, so as to form the coded data; or set the plurality of pieces of parity information behind the plurality of data blocks used for FEC coding, so as to form the coded data.

In an exemplary embodiment, the combining module 96 includes:

a second acquiring sub-module, configured to acquire discontinuous data bits from the plurality of pieces of parity information to form a plurality of pieces of target parity information; and a second combination module, configured to form the coded data by the plurality of pieces of target parity information and the plurality of data blocks used for FEC coding.

In an exemplary embodiment, the second acquiring sub-module is further configured to:

acquire, according to an interleaving rule, the discontinuous data bits from the plurality of pieces of parity information to form the plurality of pieces of target parity information; or acquire, according to preset extraction positions, the discontinuous data bits from the plurality of pieces of parity information to form the plurality of pieces of target parity information.

In an exemplary embodiment, the second acquiring sub-module includes:

an acquiring unit, configured to repeatedly acquire multiple sets of discontinuous data bits from the plurality of pieces of parity information according to an order of the plurality of pieces of parity information, each set of discontinuous data bits in the multiple sets of discontinuous data bits including a data bit acquired from each of the plurality of pieces of parity information; and a combination unit, configured to form the plurality of pieces of target parity information by the multiple sets of discontinuous data bits according to an acquiring order.

In an exemplary embodiment, the combination unit is further configured to:

in a case that a length of each piece of target parity information is greater than a length of each piece of parity information, form at least two sets of discontinuous data bits in the multiple sets of discontinuous data bits acquired from the plurality of pieces of parity information into a piece of target parity information according to the acquiring order, so as to obtain the plurality of pieces of target parity information;

in a case that the length of each piece of target parity information is equal to the length of each piece of parity information, form each set of discontinuous data bits in the multiple sets of discontinuous data bits acquired from the plurality of pieces of parity information into a piece of target parity information according to the acquiring order, so as to obtain the plurality of pieces of target parity information; and in a case that the length of each piece of target parity information is less than the length of each piece of parity information, form each set of discontinuous data bits in the multiple sets of discontinuous data bits acquired from the plurality of pieces of parity information into at least two pieces of target parity information according to the acquiring order, so as to obtain the plurality of pieces of target parity information.

In an exemplary embodiment, the apparatus further includes:

a first indication module, configured to indicate, through a physical synchronization sequence (Psync), enabling or disabling of the interleaving function, or enabling or disabling of the FEC function; or a second indication module, configured to indicate, through the Psync, enabling or disabling of the interleaving function, and enabling or disabling of the FEC function.

In an exemplary embodiment, the first indication module is further configured to:

indicate, through Psync1, disabling of the interleaving function or the FEC function, and indicate, through Psync2, enabling of the interleaving function or the FEC function; or, indicate, through the Psync, disabling of the interleaving function or the FEC function, and indicate, through a reverse or inverse sequence of the Psync, enabling of the interleaving function or the FEC function.

In an exemplary embodiment, the second indication module is further configured to:

indicate, through the Psync, disabling of the interleaving function and the FEC function;

indicate, through a reverse sequence of the Psync, enabling of the interleaving function and disabling of the FEC function;

indicate, through an inverse original sequence of the Psync, disabling of the interleaving function and enabling of the FEC function;

indicate, through an reverse sequence of the inverse original sequence of the Psync, enabling of the interleaving function and the FEC function.

An embodiment of the present disclosure further provides a computer-readable storage medium storing computer programs. The computer programs, when running on a processor, cause the processor to perform the operations in any above method embodiment.

In an exemplary embodiment, the above computer-readable storage medium may include but not limited to: a U disk, a Read-Only Memory (ROM), a Random Access Memory (RAM), a mobile hard disk, a magnetic disk or a compact disc or other media capable of storing the computer programs.

An embodiment of the present disclosure further provides an electronic device including a memory and a processor. The memory stores computer programs, and the processor is configured to run the computer programs so as to perform the operations in above any method embodiment.

In an exemplary embodiment, the above electronic device may further include a transmission device and an input and output device. The transmission device is connected to the above processor, and the input and output device is connected to the above processor.

Specific examples in the embodiment may refer to the examples described in the above embodiments and exemplary implementations, which are not described in detail in the embodiment.

Obviously, those having ordinary skill in the art should understand that the modules or operations in the present disclosure may be implemented through a universal computing device, may be centralized in a single computing device or distributed in a network formed by multiple computing devices, and may be implemented by executable program code of the computing device, such that the modules or operations may be stored in a storage apparatus to be executed by the computing device; and the shown or described operations may be executed in a different order than presented here, in some cases, or the modules or operations may be made into various integrated circuit modules, or more of the modules or operations may be made into a single integrated circuit module to be implemented. Thus, the present disclosure is not limited to any specific hardware and software combination.

The above contents are merely preferred embodiments of the present disclosure, and are not intended to limit the present disclosure, and for those having ordinary skill in the art, the present disclosure may have various modifications and changes. Any modification, equivalent replacement, improvement, etc. made within the principle of the present disclosure shall fall within the scope of protection of the present disclosure.

What is claimed is:

1. A data coding processing method, comprising:
acquiring, from a plurality of data blocks to be Forward Error Correction (FEC) coded, discontinuous data to form a plurality of target data blocks, wherein acquiring, from the plurality of data blocks to be FEC coded, the discontinuous data to form the plurality of target data blocks comprises: repeatedly acquiring multiple sets of discontinuous data from the plurality of data blocks to be FEC coded according to an order of the plurality of data blocks to be FEC coded, wherein each set of discontinuous data in the multiple sets of discontinuous data comprises a datum obtained from each of the plurality of data blocks to be FEC coded; and forming the plurality of target data blocks by the multiple sets of discontinuous data according to an acquiring order, wherein forming the plurality of target data blocks by the multiple sets of discontinuous data according to the acquiring order comprises: in a case that a length of each target data block is greater than a length of each data block to be FEC coded, forming at least two sets of discontinuous data in the multiple sets of discontinuous data acquired from the plurality of data blocks to be FEC coded into a target data block according to the acquiring order, so as to obtain the plurality of target data blocks; or in a case that the length of each target data block is less than the length of each data block to be FEC coded, forming each set of discontinuous data in the multiple sets of discontinuous data acquired from the plurality of data blocks to be FEC coded into at least two target data blocks according to the acquiring order, so as to obtain the plurality of target data blocks;
performing FEC parity information calculation for each of the plurality of target data blocks to obtain a plurality of pieces of parity information; and
forming coded data by the plurality of pieces of parity information and the plurality of data blocks to be FEC coded.

2. The method according to claim 1, wherein acquiring, from the plurality of data blocks to be FEC coded, the discontinuous data to form the plurality of target data blocks comprises:
acquiring, according to an interleaving rule, the discontinuous data from the plurality of data blocks to be FEC coded to form the plurality of target data blocks; or
acquiring, according to preset extraction positions, the discontinuous data from the plurality of data blocks to be FEC coded to form the plurality of target data blocks.

3. The method according to claim 1, wherein forming the plurality of target data blocks by the multiple sets of discontinuous data according to the acquiring order further comprises:
in a case that the length of each target data block is equal to the length of each data block to be FEC coded, forming each set of discontinuous data in the multiple sets of discontinuous data acquired from the plurality of data blocks to be FEC coded into a target data block according to the acquiring order, so as to obtain the plurality of target data blocks.

4. The method according to claim 1, wherein forming the coded data by the plurality of pieces of parity information and the plurality of data blocks to be FEC coded comprises:
respectively setting the plurality of pieces of parity information behind the data blocks corresponding to the plurality of target data blocks that correspond to the plurality of pieces of parity information, so as to form the coded data; or
setting the plurality of pieces of parity information behind the plurality of data blocks to be FEC coded, so as to form the coded data.

5. The method according to claim 1, wherein forming the coded data by the plurality of pieces of parity information and the plurality of data blocks to be FEC coded comprises:
acquiring discontinuous data bits from the plurality of pieces of parity information to form a plurality of pieces of target parity information; and
forming the coded data by the plurality of pieces of target parity information and the plurality of data blocks to be FEC coded.

6. The method according to claim 5, wherein acquiring the discontinuous data bits from the plurality of pieces of parity information to form the plurality of pieces of target parity information comprises:
acquiring, according to an interleaving rule, the discontinuous data bits from the plurality of pieces of parity information to form the plurality of pieces of target parity information; or
acquiring, according to preset extraction positions, the discontinuous data bits from the plurality of pieces of parity information to form the plurality of pieces of target parity information.

7. The method according to claim 5, wherein acquiring the discontinuous data bits from the plurality of pieces of parity information to form the plurality of pieces of target parity information comprises:
repeatedly acquiring multiple sets of discontinuous data bits from the plurality of pieces of parity information according to an order of the plurality of pieces of parity information, wherein each set of discontinuous data bits in the multiple sets of discontinuous data bits comprises a data bit acquired from each of the plurality of pieces of parity information; and forming the plurality of pieces of target parity information by the multiple sets of discontinuous data bits according to an acquiring order.

8. The method according to claim 7, wherein forming the plurality of pieces of target parity information by the multiple sets of discontinuous data bits according to the acquiring order comprises:

in a case that a length of each piece of target parity information is greater than a length of each piece of parity information, forming at least two sets of discontinuous data bits in the multiple sets of discontinuous data bits acquired from the plurality of pieces of parity information into a piece of target parity information according to the acquiring order, so as to obtain the plurality of pieces of target parity information;

in a case that the length of each piece of target parity information is equal to the length of each piece of parity information, forming each set of discontinuous data bits in the multiple sets of discontinuous data bits acquired from the plurality of pieces of parity information into a piece of target parity information according to the acquiring order, so as to obtain the plurality of pieces of target parity information; and in a case that the length of each piece of target parity information is less than the length of each piece of parity information, forming each set of discontinuous data bits in the multiple sets of discontinuous data bits acquired from the plurality of pieces of parity information into at least two pieces of target parity information according to the acquiring order, so as to obtain the plurality of pieces of target parity information.

9. The method according to claim 1, further comprising:
indicating, through a physical synchronization sequence (Psync) located at beginning of each or all of the plurality of data blocks to be FEC coded, enabling or disabling of an interleaving function, or enabling or disabling of an FEC function; or indicating, through the Psync located at beginning of each or all of the plurality of data blocks to be FEC coded, enabling or disabling of the interleaving function, and enabling or disabling of the FEC function.

10. The method according to claim 9, wherein indicating, through the Psync, enabling or disabling of the interleaving function, or enabling or disabling of the FEC function comprises:

indicating, through Psync1, disabling of the interleaving function or the FEC function, and indicating, through Psync2, enabling of the interleaving function or the FEC function; or, indicating, through the Psync, disabling of the interleaving function or the FEC function, and indicating, through a reverse or inverse sequence of the Psync, enabling of the interleaving function or the FEC function.

11. The method according to claim 9, wherein indicating, through the Psync, enabling or disabling of the interleaving function, and enabling or disabling of the FEC function comprises:

indicating, through the Psync, disabling of the interleaving function and the FEC function;

indicating, through a reverse sequence of the Psync, enabling of the interleaving function and disabling of the FEC function;

indicating, through an inverse original sequence of the Psync, disabling of the interleaving function and enabling of the FEC function;

indicating, through a reverse sequence of the inverse original sequence of the Psync, enabling of the interleaving function and the FEC function.

12. A non-transitory computer-readable storage medium, wherein the storage medium stores computer programs, and the computer programs, when running on a processor, cause the processor to perform following operations:

acquiring, from a plurality of data blocks to be Forward Error Correction (FEC) coded, discontinuous data to form a plurality of target data blocks, wherein acquiring, from the plurality of data blocks to be FEC coded, the discontinuous data to form the plurality of target data blocks comprises: repeatedly acquiring multiple sets of discontinuous data from the plurality of data blocks to be FEC coded according to an order of the plurality of data blocks to be FEC coded, wherein each set of discontinuous data in the multiple sets of discontinuous data comprises a datum obtained from each of the plurality of data blocks to be FEC coded; and forming the plurality of target data blocks by the multiple sets of discontinuous data according to an acquiring order, wherein forming the plurality of target data blocks by the multiple sets of discontinuous data according to the acquiring order comprises: in a case that a length of each target data block is greater than a length of each data block to be FEC coded, forming at least two sets of discontinuous data in the multiple sets of discontinuous data acquired from the plurality of data blocks to be FEC coded into a target data block according to the acquiring order, so as to obtain the plurality of target data blocks; or in a case that the length of each target data block is less than the length of each data block to be FEC coded, forming each set of discontinuous data in the multiple sets of discontinuous data acquired from the plurality of data blocks to be FEC coded into at least two target data blocks according to the acquiring order, so as to obtain the plurality of target data blocks;

performing FEC parity information calculation for each of the plurality of target data blocks to obtain a plurality of pieces of parity information; and forming coded data by the plurality of pieces of parity information and the plurality of data blocks to be FEC coded.

13. An electronic device, comprising a memory and a processor, wherein the memory stores computer programs, and the processor is configured to run the computer programs so as to perform following operations:

acquiring, from a plurality of data blocks to be Forward Error Correction (FEC) coded, discontinuous data to form a plurality of target data blocks, wherein acquiring, from the plurality of data blocks to be FEC coded, the discontinuous data to form the plurality of target data blocks comprises: repeatedly acquiring multiple sets of discontinuous data from the plurality of data blocks to be FEC coded according to an order of the plurality of data blocks to be FEC coded, wherein each set of discontinuous data in the multiple sets of discontinuous data comprises a datum obtained from each of the plurality of data blocks to be FEC coded; and forming the plurality of target data blocks by the multiple sets of discontinuous data according to an acquiring order, wherein forming the plurality of target data blocks by the multiple sets of discontinuous data according to the acquiring order comprises: in a case that a length of each target data block is greater than a length of each data block to be FEC coded, forming at least two sets of discontinuous data in the multiple sets of discontinuous data acquired from the plurality of data blocks to be FEC coded into a target data block according to the acquiring order, so as to obtain the plurality of target data blocks; or in a case that the length of each target data block is less than the length of each data block to be FEC coded, forming each set of discontinuous data in the multiple sets of discontinuous data acquired from the plurality of data blocks to be FEC coded into at least two target data blocks according to the acquiring order, so as to obtain the plurality of target data blocks;

performing FEC parity information calculation for each of the plurality of target data blocks to obtain a plurality of pieces of parity information; and forming coded data by the plurality of pieces of parity information and the plurality of data blocks to be FEC coded.

14. The electronic device according to claim 13, wherein acquiring, from the plurality of data blocks to be FEC coded, the discontinuous data to form the plurality of target data blocks comprises:

acquiring, according to an interleaving rule, the discontinuous data from the plurality of data blocks to be FEC coded to form the plurality of target data blocks; or acquiring, according to preset extraction positions, the discontinuous data from the plurality of data blocks to be FEC coded to form the plurality of target data blocks.

15. The electronic device according to claim 13, wherein forming the coded data by the plurality of pieces of parity information and the plurality of data blocks to be FEC coded comprises:

respectively setting the plurality of pieces of parity information behind the data blocks corresponding to the plurality of target data blocks that correspond to the plurality of pieces of parity information, so as to form the coded data; or setting the plurality of pieces of parity information behind the plurality of data blocks to be FEC coded, so as to form the coded data.

16. The electronic device according to claim 13, wherein forming the coded data by the plurality of pieces of parity information and the plurality of data blocks to be FEC coded comprises:

acquiring discontinuous data bits from the plurality of pieces of parity information to form a plurality of pieces of target parity information; and forming the coded data by the plurality of pieces of target parity information and the plurality of data blocks to be FEC coded.

* * * * *